United States Patent [19]

Akimoto et al.

[11] Patent Number: 4,954,895

[45] Date of Patent: Sep. 4, 1990

[54] SOLID-STATE IMAGING DEVICE INCLUDING PHOTOELECTRIC CONVERSION ELEMENTS INTEGRATED AT A SURFACE OF A SEMICONDUCTOR SUBSTRATE

[75] Inventors: Hajime Akimoto, Hachioji; Shinya Ohba, Kanagawa, both of Japan

[73] Assignee: Hitachi, Ltd., Tokyo, Japan

[21] Appl. No.: 278,844

[22] Filed: Dec. 2, 1988

[30] Foreign Application Priority Data

Dec. 4, 1987 [JP] Japan .................. 62-305637

[51] Int. Cl.$^5$ .............................................. H04N 3/14
[52] U.S. Cl. .................................. 358/213.11; 357/24
[58] Field of Search .............. 358/213.11; 357/24 LR, 357/30 H, 30 I, 30 Q; 250/578

[56] References Cited

U.S. PATENT DOCUMENTS

| | | | |
|---|---|---|---|
| 4,607,168 | 8/1986 | Oritsuki et al. | 358/213.11 |
| 4,672,454 | 6/1987 | Cannella et al. | 358/213.11 |
| 4,758,734 | 7/1988 | Uchida et al. | 358/213.11 |
| 4,764,682 | 8/1988 | Swartz | 358/213.11 |
| 4,788,594 | 11/1988 | Ovshinsky et al. | 358/213.11 |

FOREIGN PATENT DOCUMENTS 55-110476A 8/1980 Japan.

OTHER PUBLICATIONS

IDEM 86, Tech Dig. pp. 369-372.

Primary Examiner—Stephen Brinich
Attorney, Agent, or Firm—Antonelli, Terry, Stout & Kraus

[57] ABSTRACT

A solid-state imaging device has a plurality of photodiodes (photoelectric conversion elements) formed in a surface of a semiconductor substrate in a matrix configuration and reading means for reading out signal charges stored in the photodiodes in accordance with the incident lights in a predetermined order. This reading means includes active elements, such as MOS type transistors, connected to each of the photodiodes. A MOS type transistor constituting part of theses active elements is provided in the path of the transmitting incident light for the associated photodiode. By this configuration, the area occupied by one picture element is reduced as far as the processing steps allow.

13 Claims, 9 Drawing Sheets

F I G. 6
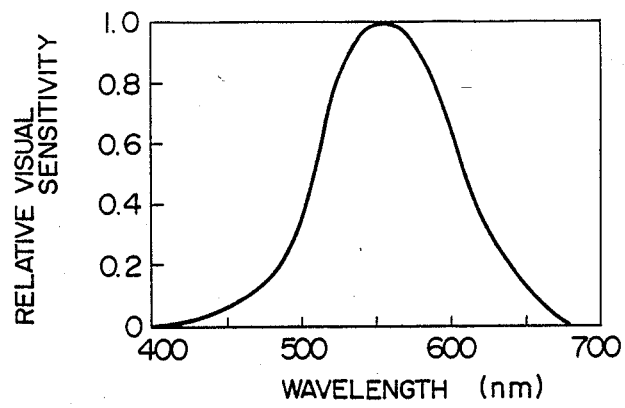
RELATIVE VISUAL SENSITIVITY CHARACTERISTIC
(BRIGHT SENSE)
F I G. 7
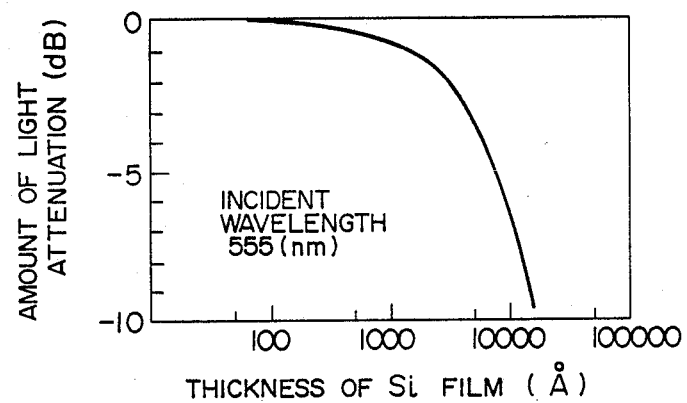
ATTENUATION OF LIGHT VS THICKNESS OF Si FILM

SOLID-STATE IMAGING DEVICE INCLUDING PHOTOELECTRIC CONVERSION ELEMENTS INTEGRATED AT A SURFACE OF A SEMICONDUCTOR SUBSTRATE

BACKGROUND OF THE INVENTION

1. Field of the Invention

This invention relates to an imaging or image pick-up device, and more particularly to a solid-state imaging device in which photoelectric conversion elements, etc. are integrated on a semiconductor substrate.

2. Description of the Related Art

The solid-state imaging device is required to have a comparable resolution to that of the image pick-up electronic tube used in the current television broadcasting. Therefore, it is necessary to form on a semiconductor substrate, a picture element (photoelectric conversion element) matrix which includes 500 cells in the vertical (column) direction and 800 to 1000 cells in the horizontal (row) direction, and scanning elements corresponding thereto. Therefore, the solid state imaging device is manufactured by using the MOS LSI technology which is capable of high integration and generally employs the charge coupled device (CCD) or the MOS transistor as the constituent element.

This prior art will be described referring to the drawings, hereinbelow.

FIG. 1 is a circuit diagram showing the conceptual structure of the conventional MOS type solid-state imaging device.

Photoelectric conversion elements are made of photodiodes 1 and disposed regularly in a two-dimensional (matrix) form of the horizontal and the vertical directions. The photodiode stores a signal charge which corresponds to the quantity of incident light. To each of the photodiodes 1, the source side of a vertical switching MOS transistor (vertical MOST) 4 is connected. The gates of the vertical MOST's 4 in one horizontal line (row) are connected to a vertical scan circuit 2 through a vertical gate line 3. The drain sides of the vertical MOST's 4 in one vertical line (column) are connected to a vertical signal line 8. The vertical MOST's are turned on and off by the selection signal supplied from the vertical scan circuit 2. At each one end of the vertical signal lines 8, the source side of a horizontal switch MOST transistor (horizontal MOST) 6 is connected. The gates of the horizontal MOST's 6 are connected to respective gate lines of a horizontal scan circuit. The drain sides of the horizontal MOST's 6 are connected commonly to an external amplifier 7 through a horizontal signal line 9. The horizontal MOST's 6 are turned on and off by the selection signal supplied from a horizontal scan circuit 5.

Hereinbelow, the operation of thin solid-state imaging device will be explained. Firstly, in the horizontal blanking period, the voltage of a vertical gate line 3 of a row selected by the vertical scan circuit 2 rises high to open the vertical switches 4 of the row at the same time. Then, the signal charges are sent from the photodiodes 1 to the vertical signal lines 8. Then, in the horizontal scan period, the horizontal scan circuit 5 operates to successively opens and closes the horizontal switches 6. The signal charges are successively amplified in the external amplifier 7 and outputted through an output terminal 10.

FIG. 2 shows a cross-sectional structure of one picture element comprising a photodiode 1 and a vertical MOST 4. In a semiconductor substrate 11 of a first conductivity type, an impurity dosed region 14 of a second conductivity type (a conductivity type different from that of the semiconductor substrate 11) for forming a photodiode 1 and another impurity dosed region 16 of the second conductivity type for forming the drain of a vertical MOST 4 are disposed. Here, the impurity dosed region 14 also serves as the source of the vertical MOST 4. On the surface of the semiconductor substrate 11, a gate electrode 3' of the vertical MOST 4 is disposed with the interposition of an insulating oxide film 12. A vertical signal line 8 is connected to the impurity dosed region 16 which constitutes the drain.

The solid-state imaging device of this kind has an advantage that integration is relatively easy because of the use of the MOS LSI technology which allows the manufacture of an integrated structure of photoelectric conversion elements and switching elements. For example, JP-A-55-110476 discloses a solid-state imaging device of this kind.

Next, a solid-state imaging device employing an SOI (silicon-on-insulator) structure will be explained. With this respect, reference may be made to IEDM 86, Tech. Dig., pp. 369–372, which is incorporated herein by reference.

This SOI solid-state imaging device has a similar equivalent circuit to the circuit of FIG. 1, but has a different structure of the vertical MOST 4. FIG. 3A shows a cross-sectional structure of one picture element of this SOI solid-state imaging device, in analogy to the structure of FIG. 2. In a semiconductor substrate 11 made of p type silicon, an impurity dosed n+ type region 14 for forming a photodiode is disposed and isolated by a thermal oxide film 12 and a p+ type diffusion layer 17. A vertical MOST comprising a source 19, a drain 20 and a gate 3' extends from this n+ type impurity dosed region 14 onto the thermal oxide film 12. The source 19 is connected to the impurity dosed region 14 at the right end portion thereof through surface contact. The general structure is covered with a passivation film 18. A signal line 8 is connected to the drain 20. Here, since the vertical MOST comprising the source 19, the drain 20 and the gate 3' is formed in an SOI structure, it is possible to reduce the parasitic capacitance between the drain 20 and the p type silicon substrate. Therefore, the parasitic capacitance of the signal line 8 can also be reduced to suppress the output noise level. This is because the square of the output noise current is proportional to the total capacitance of the signal line 8.

FIG. 3B shows a plan lay-out of one picture element shown in FIG. 3A. At the right end of the impurity dosed region 14 for forming a photodiode, the source 19 of a vertical MOST 4 of an SOI structure is connected. This SOI structure further constitutes a vertical MOST comprising a source 19, a drain 20 and a gate 3', outside of the impurity dosed region 14 for forming the photodiode.

As FIG. 3B shows a plan lay-out of an SOI solid-state imaging device, the MOST type solid-state imaging device of FIG. 2 may be considered to have a similar plan lay-out.

As is apparent from the cross-sections of FIGS. 2 and 3A and the plan lay-out of FIG. 3B, according to the conventional art, the vertical MOST for reading out the signal charge is provided near but separately from the impurity dosed region for forming the photodiode. Therefore, letting the area occupation ratio of this vertical MOST per one picture element be about 10%, the area of about 10% in total does not contribute to photoelectric conversion. The impurity dosed region for forming the photodiode requires a certain occupation area for providing a predetermined signal-to-noise (S/N) ratio. For increasing the resolution of the solid-state imaging device, it is necessary to reduce the occupation area of one picture element as far as possible. According to the conventional art as explained above, however, there exists a certain limit in the occupation area per one picture element. Thus, there is a problem that high resolution cannot be realized.

SUMMARY OF THE INVENTION

An object of this invention is to provide a solid-state imaging device which has reduced the occupation area per one picture element and is adapted for realizing high resolution.

The above-mentioned object can be achieved by a solid-state imaging device comprising a plurality of photoelectric conversion elements for storing signal charges corresponding to light information, disposed in a surface of a semiconductor substrate two-dimensionally, and means for reading out said signal charges stored in the photoelectric conversion elements, disposed separately from the photoelectric conversion elements, wherein at least one of elements constituting said reading means is formed above the region of the photoelectric conversion elements in said semiconductor substrate.

According to this invention, an active element constituting the means for reading out the signal charge stored in the light receiving portion on the means for signal-processing the signal charge is formed not on an isolation region made of a thermal oxide film as in the conventional art, but on the photodiode. Therefore, the isolation region can be reduced as small as possible as far as the process allows. Thus, the respective picture elements can be miniaturized, to enhance high resolution of the solid-state imaging device.

These and other objects and many of the attendant advantages of this invention will be readily appreciated as the same becomes better understood by reference to the following detailed description when considered in connection with the accompanying drawing.

BRIEF DESCRIPTION OF THE DRAWINGS

FIG. 6 is a graph showing the relative visual sensitivity of the human being.

FIG. 7 is a graph showing the light attenuation in a silicon thin film.

DESCRIPTION OF THE PREFERRED EMBODIMENTS

Figure 1:
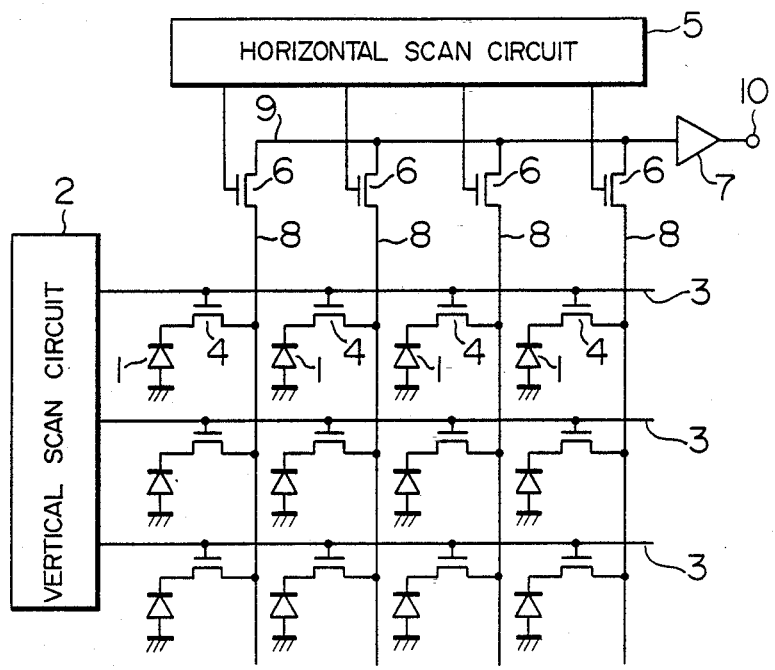
FIG. 1 is a circuit diagram showing a fundamental structure of a conventional MOS type solid-state imaging device.
Figure 2:
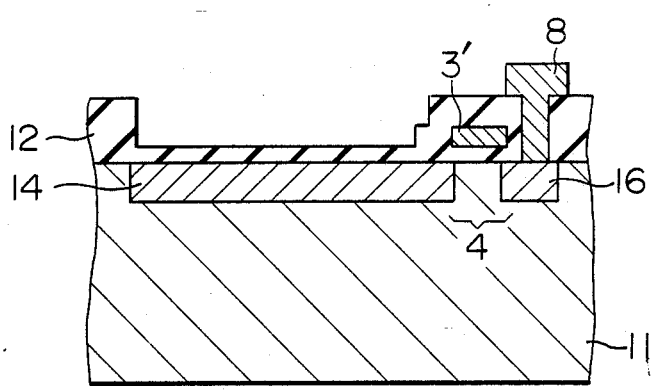
FIG. 2 is a cross-section of one picture element used in the device of FIG. 1.
Figure 3A:
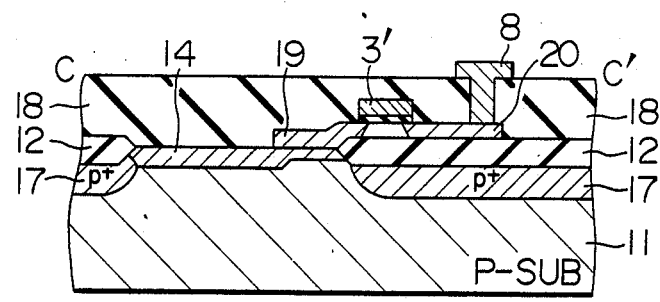
FIGS. 3A and 3B show a cross-sectional structure and a plan lay-out of one picture element in a conventional SOI solid-state imaging device.
Figure 3B:
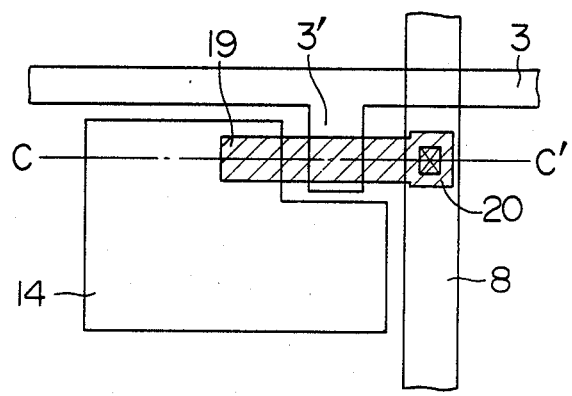

An embodiment of this invention will hereinbelow be explained, referring to FIGS. 4 and 5. FIG. 5 shows the circuit structure of the embodiment. In a p type well in an n type silicon substrate there are provided a plurality of photodiodes 1, vertical MOS transistor switches 4 and horizontal MOS transistor switches 6' for selecting the respective photodiodes, and horizontal signal liens 27, reading MOS transistors 23 and a vertical signal line 22 for transferring the signal charges stored in the photodiodes, etc. At the end of the vertical signal line 22, an amplifier 7, a feed-back resistor 24 for the amplifier 7 and an output terminal 25 are provided.

The vertical MOS transistor switches 4 and the reading MOS transistor switches 23 are scanned by a vertical scan circuit 2 through vertical gate lines 21. The horizontal MOS transistor switches 6' are scanned by a horizontal scan circuit 5 through horizontal gate lines 26. The operation of this embodiment is explained hereinbelow. Signal charges generated by lights incident on the photodiodes are stored in the photodiodes 1. These signal charges are successively read out from the respective photodiodes through the vertical MOS transistor switches 4 and the horizontal MOS transistor switches 6', which are controlled by the vertical scan circuit 2 and the horizontal scan circuit 5. The signal charges thus read out from the photodiodes 1 to the horizontal signal lines 27 are inputted to the amplifier 7 through the read-out MOS transistor switches 23 and the vertical signal line 22. Thus, output signal is generated on the output terminal 25.

Figure 4A:
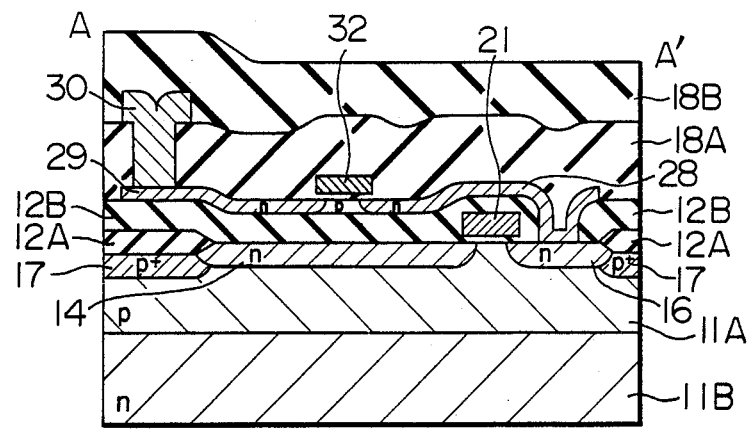
FIGS. 4A and 4B show a cross-sectional structure and a plan lay-out of one picture element in a solid-state imaging device according to an embodiment of this invention.
Figure 4B:
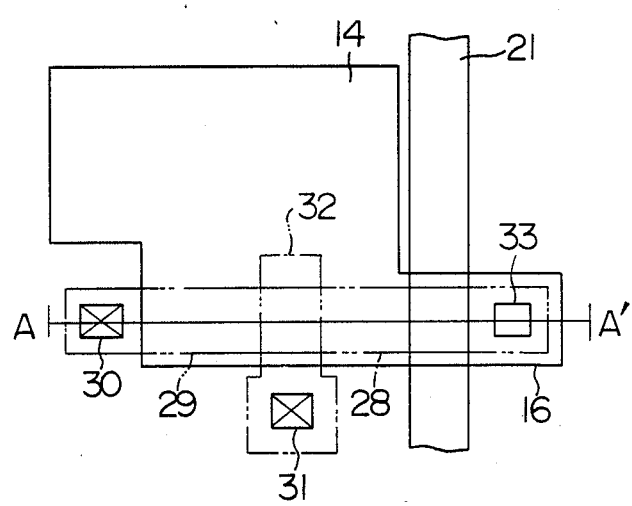
Figure 5:
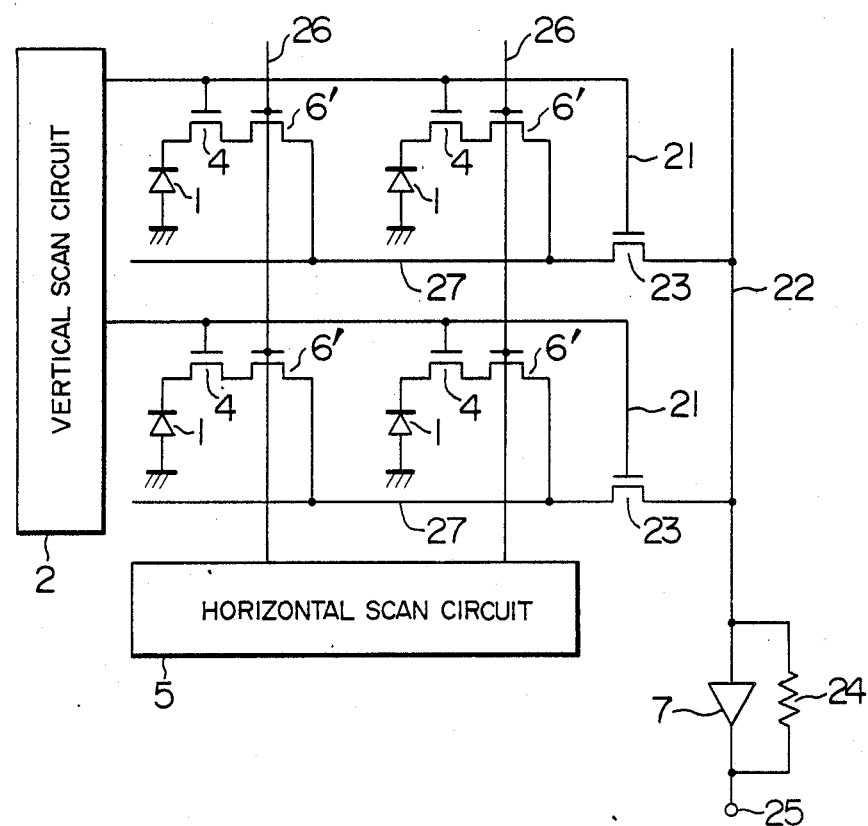
FIG. 5 is a circuit diagram for illustrating the structure of a solid-state imaging device according to an embodiment of this invention.

FIGS. 4A and 4B show a cross-sectional structure and a plan view lay-out of one picture element of the device. In FIG. 4B, those portions which are indicated by solid liens denote structures formed on the silicon substrate, and those portions which are indicated by a broken line and a dotted broken line denote a so-called SOI structure formed in a silicon region formed above the silicon substrate with an interposition of an insulating member. Namely, the impurity dosed region 14 for forming a photodiode 1 which also serves as the source of a vertical MOS transistor switch 4, the gate 21 and the drain 16 are formed on the silicon substrate 11A, 11B, while the source 28, the gate 32 and the drain 29 of a horizontal MOS transistor switch 6' are in an SOI structure formed on an insulating oxide film 12B. A contact 33 connects the silicon substrate 11A, 11B with the horizontal MOS transistor 6' of the SOI structure. A contact 30 connects the drain 39 of the horizontal MOS transistor switch 6' and the horizontal signal line 27. A contact 31 connects the gate 32 of the horizontal MOS transistor switch 6' and the horizontal gate line 26. In FIG. 4B, the horizontal gate line 26 and the horizontal signal line 27 are not shown for the sake of brevity of the figure. As can be seen from the figures, although the structure of this embodiment is far more complicated than the conventional one, the dimensions of the picture element can be made relatively small by disposing on the photodiode 1 the horizontal MOS transistor switch 6' formed in the SOI structure.

FIG. 4A shows a cross-section along line A—A' of FIG. 4B. In a p type well 11A formed on an n type silicon substrate 11B, there are provided an n type diffusion layer 14 of an impurity doped region forming a photodiode 1 isolated by a thermal oxide film 12A and p+ type diffusion layer 17, and a gate 21 and a drain 16 of the vertical MOS transistor switch 4. Further, on the impurity doped region 14 for forming the photodiode 1, an insulating layer 12B is formed. In a silicon region disposed on this insulating layer 12B, a horizontal MOS transistor switch 6' comprising a source 28, a gate 32 and a drain 29 is provided. Here, numerals 18A and 18B denote insulating films and 30 a contact to the horizontal signal line 27.

The thickness, in the depth direction, of the silicon region for forming the horizontal MOS transistor switch 6' is thinner the better, and is preferably selected practically 1000 Å or below. Description will be made later on this point. Among the lights incident on a solid-state imaging device, those which practically generate signal charges are only those absorbed by the semiconductor within the photodiodes. Therefore, when a semiconductor region is provided above the photodiode 1, the sensitivity of the solid-state imaging device will be lowered by the amount of lights absorbed by this semiconductor region. The amount of decrease in the sensitivity, i.e. the amount of lights absorbed in this semiconductor region, however, depends on the wavelength of the light and the thickness of the semiconductor region. FIGS. 6 and 7 illustrate these circumstances. FIG. 6 shows the characteristic of the relative visual sensitivity of the human being, in which the abscissa represents the wavelength of light and the ordinate represents the relative visual sensitivity. It can be seen from FIG. 6 that the visual region for the human being is, in the wavelength of light, from about 400 nm to about 690 nm. It can also be seen that the visual sensitivity of the human being is the highest in the vicinity of 555 nm and drops swiftly when the wavelength depart from the high sensitivity region. In short, for the visual sense of the human being, the S/N ratio of the lights in the vicinity of the wavelength 555 nm is most important. FIG. 7 shows the attenuation of light of this wavelength 555 nm when transmitting through a silicon thin film. The abscissa represents the film thickness of the silicon thin film and the ordinate represents the attenuation of light. As is apparent from FIG. 7, the attenuation of light becomes small as the film thickness is made thinner. Therefore, the amount of transmitted light increases. Most of the light transmits the film if the film thickness of the Si thin film is 1000 Å or below. Thus, with respect to the silicon region formed above the photodiode 1 also, the decrease in the sensitivity of the photodiode due to the existence of this silicon region can be suppressed to an amount of negligible order for the visual sense of the human being, by limiting the thickness in the depth direction not higher than 1000 Å.

Further, in this embodiment, among the vertical and the horizontal MOS transistor switches 4 and 6' provided for each photodiode 1, the switch which is nearer to the photodiode 1, i.e. the vertical MOS transistor switch 4 is provided in the silicon substrate. Generally speaking, the MOS transistor switch formed in an SOI structure has a larger leak current in the off state compared to the bulk MOS transistor switch. If both the vertical and the horizontal MOS transistor switches are formed in an SOI structure, the S/N ratio of the output signal may be deteriorated. Therefore, the vertical MOS transistor switch 4 is formed in the substrate.

Figure 8:
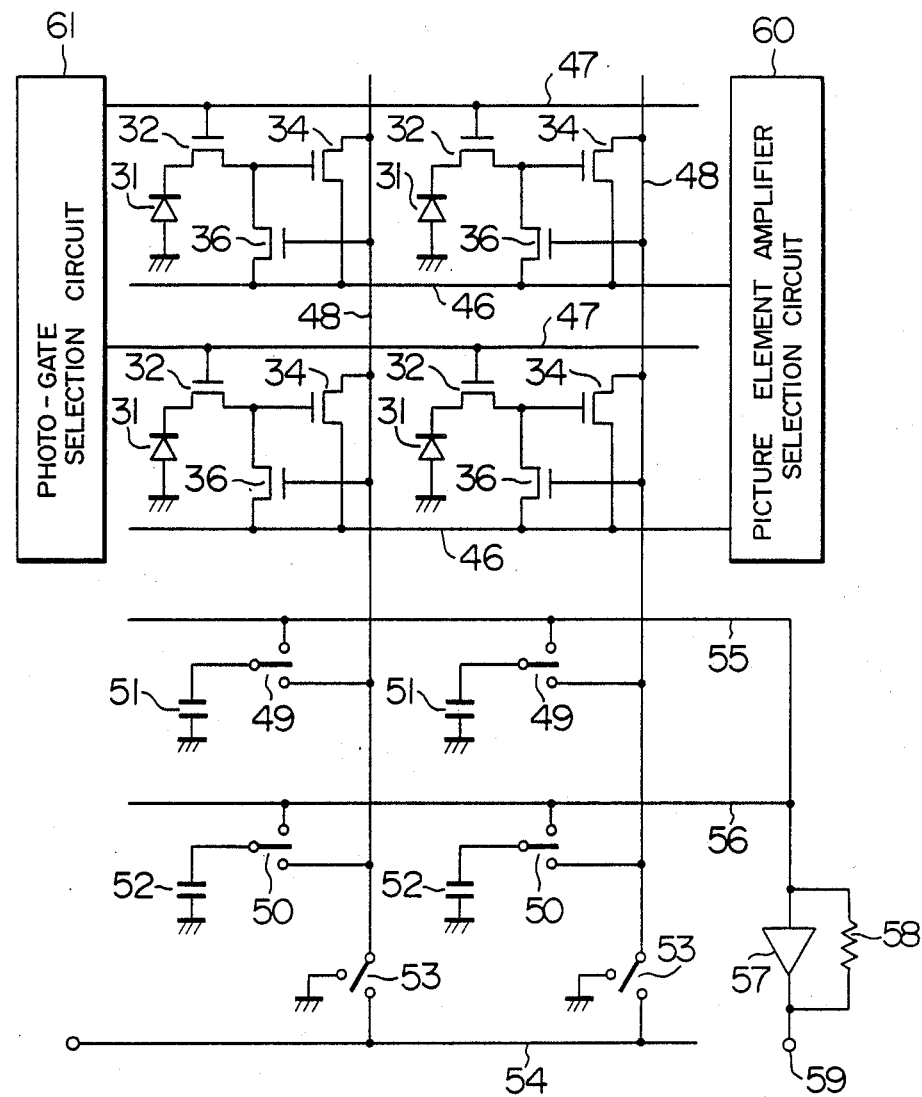
FIGS. 8, 9A and 9B, 10A and 10B, and 11 illustrate other embodiments of this invention.

Another embodiment of this invention will be described referring to FIGS. 8, 9A and 9B. FIG. 8 is a circuit diagram of this embodiment. Each picture element is provided with a photodiode 31, a photo-gate MOS transistor switch 32 for reading out the signal charge on the photodiode 31, a picture element amplifier MOS transistor 34 for amplifying the signal charge and a reset MOS transistor switch 36 for resetting the signal charge, etc. A plurality of picture elements are disposed in a matrix of rows and columns. There are further provided for each vertical column in the circuit, a vertical signal line 48 for transferring the amplified signal charges, storage capacitances 51 and 52 for storing the transferred signal charges through switches 49 and 50, etc. Further, there are provided horizontal signal lines 55 and 56 for connecting the switches 49 and 50 in the horizontal direction and connecting them to an output amplifier 57 having a feed-back resistor 58, and to an output terminal 59. The photo-gate MOS transistor switches 32 are scanned by a photo-gate selection circuit 61 through photo-gate lines 47. The drain of the picture element amplifier MOS transistor 34 and the drain of the reset MOS transistor 36 are scanned by a picture element amplifier section circuit 60 through drain lines 46. The vertical signal lines 48 connected to the gates of the resetting MOS transistors 36 are connected to a reset gate line 54 through switches 53.

The operation of this embodiment will be described hereinbelow. The signal charge generated by lights incident on a photodiode 31 and stored in the photodiode 31 generates an output signal through the following procedures. At first, with respect to picture elements in a row in horizontal direction to be read out, the drain line 46 is held at a high level voltage $V_H$ in a beginning portion of the horizontal blanking period. Then, switches 53 in a row are all turned on. Here, the high level voltage $V_H$ is preliminarily applied to the reset gate line 54. Then, the reset MOS transistors 36 are opened and the gate voltage of the picture element amplifier MOS transistors 34 is reset to ($V_H - V_{THR}$). Here, $V_{THR}$ represents the threshold voltage of the reset MOS transistor switch 36, and takes a positive value. The voltage $V_H$ also takes a positive value. Then, the switches 53 are once connected to the off position, i.e. connected to the ground potential, thereby allowing the voltage of the vertical signal lines 48 to drop from $V_H$ to a low potential. The switches 53 are then floated. Here, the voltage of the vertical signal lines 48 rises again as sooner as the switches 53 are floated, to ($V_H - V_{THR} - V_{THA}$) due to the action of the picture element amplifier MOS transistor 34. Thus, the off position of the switches 53 may not be the ground potential, and may be any low potential which allows the potential of the vertical signal line 48 to become ($V_H - V_{THR} - V_{THA}$) or below. Here, $V_{THA}$ represents the threshold voltage of the picture element amplifier MOS transistor 34, and is assumed to take a positive value. Then, the switches 49 connect the storage capacitors 51 and the associated vertical signal lines 48, to allow the voltage of the storage capacitors 51 to become ($V_H - V_{THR} - V_{THA}$). By re-floating the switches 49, the reading of the reset voltage level to the storage capacitors 51 is completed. With respect to a row of picture elements in one horizontal row, under interest, when the photo-gate MOS transistor switches 32 connected to one photo-gate line 47 are turned on, the signal charges stored in the photodiodes 31 are read out to the gates of the picture element amplifier MOS transistors 34. Here, the photodiodes 31 are preferably designed in such a state that the photodiodes 31 after being read out of the signal charge becomes completely depleted with no residual charge. Then, improvements in the characteristics such as suppressions of the after-image and the noise can be expected. Here, letting the read-out signal charge be $-Q_S$, and the total capacitance associated with the gate of the picture element amplifier MOS transistor 34 be $C_A$, the gate voltage of the picture element amplifier MOS transistor 34 becomes $(V_H - V_{THR} - Q_S/C_A)$. Here, since the reset MOS transistor 36 should not be turned on, the following relation should hold:

$$V_{THR} + V_{THA} > Q_S/C_A \qquad (1).$$

Then, when the switches 53 are once connected to the off position, i.e. to the ground potential, and then floated, the voltage of the vertical signal lines 48 becomes $(V_H - V_{THR} - V_{THA} - Q_S/C_A)$. Here, the off position of the switches 53 may not be the ground potential similar to the previous off state. Then, the switches 50 connect the storage capacitors 52 and the associated vertical signal lines 48 to allow the voltage of the storage capacitors 52 to become also $(V_H - V_{THR} - V_{THA} - Q_S/C_A)$. When the switches 50 are floated again, the reading of the signal voltage levels into the storage capacitors 52 is completed. The procedures up to this point are the actions in the horizontal blanking period of the video output.

In the signal output period, the following actions are done. First, a switch 49 connects the associated storage capacitor 51 with the horizontal signal line 55. Along with the reset of the storage capacitor 51, the electric charge corresponding to the reset voltage level is inputted to the output amplifier 57 to provide a reset output at the output terminal 59. Then, a corresponding switch 50 connects the associated storage capacitor 52 with the horizontal signal line 56. Along with the reset of the storage capacitor 52, an electric charge corresponding to the signal voltage level is inputted to the output amplifier 57 to provide a signal output at the output terminal 59. By taking the difference of these reset and signal outputs appearing at the output terminal 59, an output for one picture element is obtained finally. Therefore, by repeating the above actions for pairs of the storage capacitors 51 and 52 in the horizontal direction, an output corresponding to one horizontal scanning line can be provided. In the present embodiment, each difference of the reset output and the signal output is taken as explained above. Thus, the reset noises generated by the reset MOS transistor switch 36, the fixed pattern noises due to the dispersion in the threshold voltage of the respective transistors among the picture elements which are usually of problem in the picture element amplifier type solid-state imaging device, etc. can be avoided.

Figure 9A:
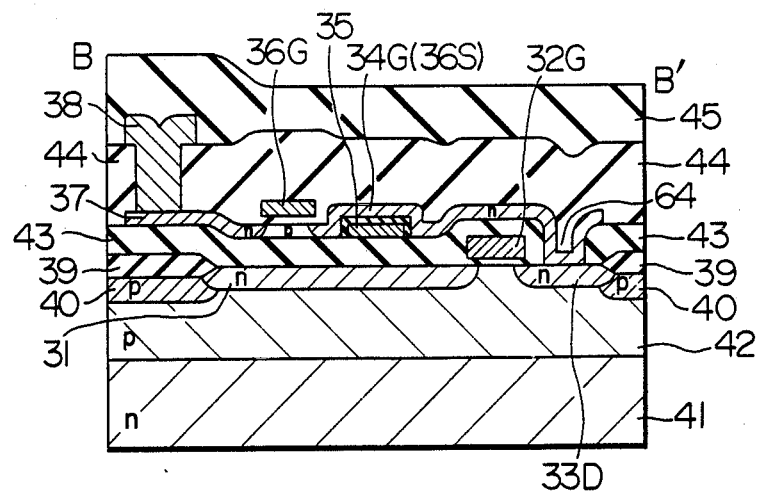

FIG. 9A shows a cross-sectional structure of one picture element of the imaging device of FIG. 8. FIG. 9B shows a plan view lay-out of the picture element of FIG. 9A. In FIG. 9B, those portions which are indicated by solid liens denote structures formed on the silicon substrate, and those portions which are indicated by broken lines and a dotted broken line denote a so-called SOI structure formed in a silicon region formed above the silicon substrate with an interposition of an insulating member, similar to the case of FIG. 4B. Namely, the photodiode 31 which also serves as the source of the photo-gate MOS transistor switch 32, the gate 32G and the drain 33D are formed in the silicon substrate 41, 42, while the source 62, the channel 35, the gate 34G (36S) and the drain 63 of the picture element amplifier MOS transistor 34 and the source 36S (34G), the gate 36G, and the drain 37 of the reset MOS transistor switch 36 are formed in an SOI structure. Here, a reference numeral 64 denotes a contact for connecting the silicon substrate with the SOI structure, 65 a contact between the source 62 of the picture element amplifier MOS transistor 34 and the vertical signal line 48, 66 a contact between the drain 63 and the drain line 46, 67 a contact between the gate 36G of the reset MOS transistor switch 36 and the vertical signal line 48, and 68 a contact between the drain 37 and the drain line 46. In FIG. 9B, the vertical signal line 48 and the drain line 46 are not shown for the brevity of representation.

Figure 9B:
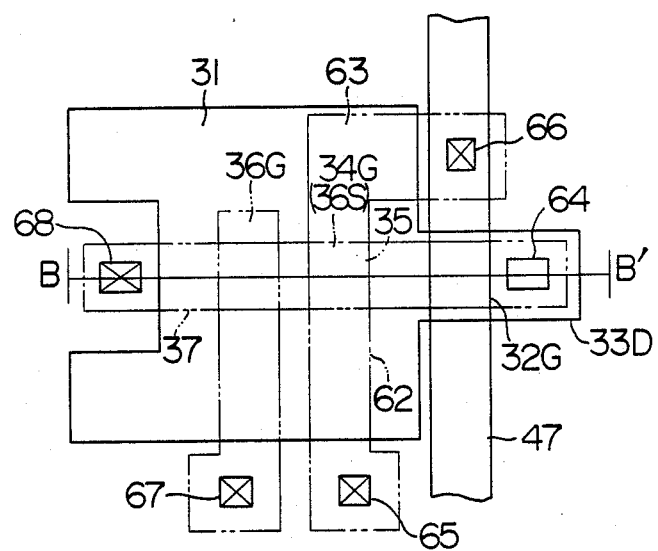

FIG. 9A shows a cross-section of FIG. 9B along the line B—B'. In the p type well 42 formed on the n type silicon substrate 41, there are formed the photodiode n layer 31 isolated by the thermal oxide film 39 and the p type diffusion layer 40, and the gate 32G and the drain 33D of the photo-gate MOS transistor switch 32. Further, above the photodiode 31, the reset MOS transistor switch 36 comprising the source 36S, the gate 36G and the drain 37 is formed in a silicon region formed with the interposition of an insulating layer 43. This source 36S also serves as the gate 34G of the picture element amplifier MOS transistor 34. Numerals 44 and 45 denote insulating films and numeral 38 denotes the drain line 46.

In the present embodiment, too, it is preferable to select the thickness in the depth direction, of the silicon region provided above the photodiode 31 to be 1000 Å or less, similar to the case of the above-mentioned embodiment.

In the present embodiment, too, the MOS transistors switch directly connected to the photodiode, i.e. the photo-gate MOS transistor switch 32 is formed not in the SOI but in the silicon substrate. This configuration is made for avoiding the deterioration of the S/N ratio of the output signal by the leak current upon turning off the MOS transistor switch, also similar to the previous embodiment.

Figure 10A:
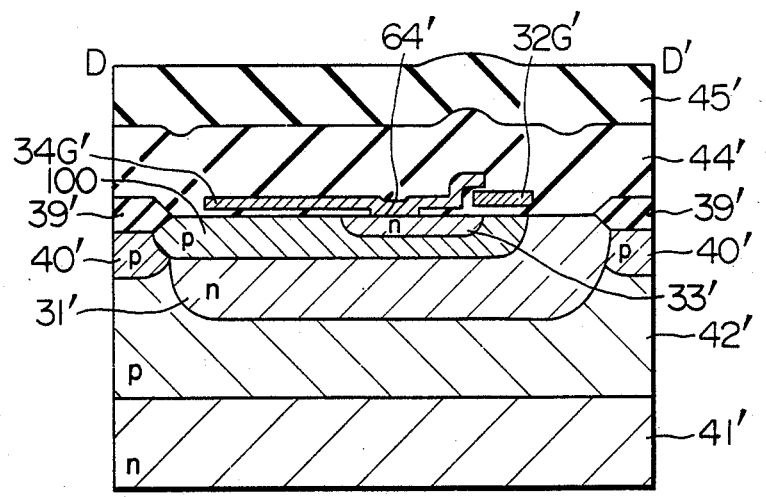
Figure 10B:
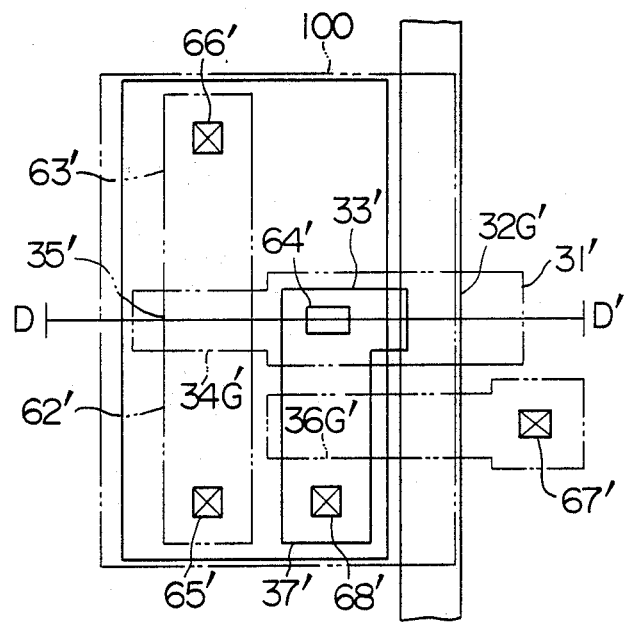

Another embodiment of this invention will be described hereinbelow referring to FIGS. 10A and 10B. Since the circuit connection diagram and the operation of this embodiment are the same as those of the embodiment explained with reference to FIG. 8, the explanations thereof are omitted. The lay-out in the vicinity of one photodiode according to this embodiment is shown in FIG. 10B. In FIG. 10B, differing from FIGS. 4B and 9B, all the portions indicated by solid, broken, dotted broken and double-dotted broken lines are the structures formed in or on the silicon substrate such as ion implantation, oxide film, poly-silicon gate, and not the so-called SOI structures. Namely, on a photodiode 31' which also serves as the source of a photo-gate MOS transistor switch 32', a shallow well 100 is formed. In this shallow well 100, several active elements are formed. More specifically, a gate 32'G and a drain 33' of a photo-gate MOS transistor switch 32', a source 62', a gate 34'G and a drain 63' of a picture element amplifier MOS transistor 34', and a source 33', a gate 36'G and a drain 37' of a reset MOS transistor switch 36', etc. are formed on or in the shallow well 100. Here, numeral 64' denotes a contact between an impurity diffusion layer 33 which serves as the source of the reset MOS transistor switch 36' and as the drain of the photo-gate MOS transistor switch 32', and a poly-silicon gate 34'G of the picture element amplifier MOS transistor 34'. Also, numeral 65' denotes a contact between a source 62' of the picture element amplifier MOS transistor 34' and the vertical signal line 48, 66' a contact between the drain 63' and the drain line 46', 67' a contact between the gate 36'G of the reset MOS transistor switch 36' and the vertical signal line 48', and 68' a contact between the drain 37' and the drain line 46'. In FIG. 10B, the vertical signal line 48' and the drain line 46' are not shown for the sake of brevity of representation, similar to FIG. 9B. In FIGS. 10A and 10B, reference numerals with a dash such as 31', 32', ... denote the corresponding structures with no dash such as 31, 32, ... in FIGS. 9A and 9B.

A cross-section of FIG. 10B along line D—D' is shown in FIG. 10A. In a p type well 42' formed on an n type silicon substrate 41', a photo-diode n type layer 31' isolated by a thermal oxide film 39' and a p type diffusion layer 40' is provided. On this photodiode n type layer 31', a p type well 100 is formed. This shallow p well 100 contacts a p type diffusion layer 40' at a portion, and hence is biased at the same potential as that of the p type well 42'. In this shallow p type well 100, there are formed the gate 32'G and the drain 33' of the photo-gate MOS transistor switch 32', and the gate 34'G of the picture element amplifier MOS transistor 34', etc. Here, the drain 33' also serves as the source of the reset MOS transistor switch 36', as is described before. In the present embodiment, it is of course desirable for improving the signal sensitivity to reduce the depth or the thickness of the poly-silicon gates 34'G, 36'G, the n type diffusion layers 33', 37', 63', 62' etc. as far as possible.

Another embodiment of this invention will be described hereinbelow referring to FIG. 11. Because the circuit construction and the operation of this embodiment are the same as those of the conventional art explained in connection with FIG. 1, the explanations thereof are dispensed with.

Figure 11:
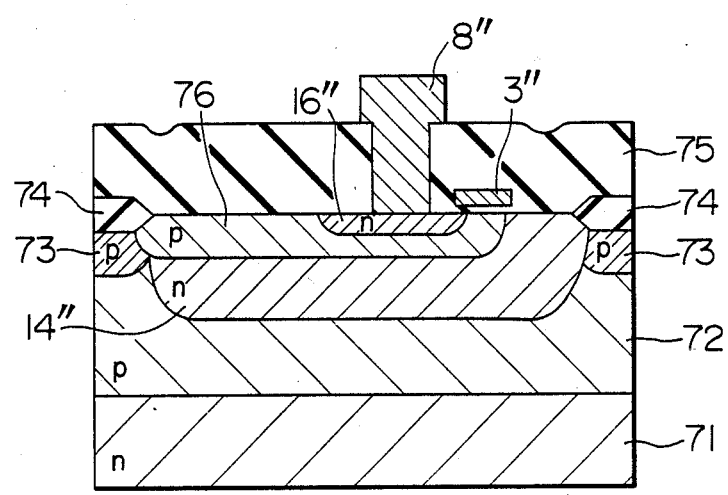

FIG. 11 shows a cross-sectional structure of a picture element according to this embodiment which corresponds to a picture element of FIG. 1 comprising a photodiode 1 and a vertical MOST 4. On a p type well 72 formed on an n type silicon substrate 71, an n type diffusion layer 14" for constituting a photodiode is formed. Further, a shallow p type well 76 is formed on this n type diffusion layer 14", and an n type diffusion layer 16" constituting the drain of the vertical MOST is formed on the shallow p type well 76. Here, the n type diffusion layer 14" also serves as the source of the vertical MOST. On part of the surface of the shallow p type well 76, a gate electrode 3" of the vertical MOST is formed through an insulating film 75. A vertical signal line 8" is connected to the n type diffusion layer 16" which serves as the drain of the vertical MOST. Here, numerals 74 and 73 represent a thermal oxide film and a p type diffusion layer for the isolation of the element. In the present embodiment too, it is desirable for improving the signal sensitivity to reduce the thickness or the depth of the gate electrode 3" formed on the shallow p type well 76 and the n type diffusion layer 16" as far as possible.

It will be apparent that the conductivity types of n and p may be reversed with the inversion of the polarity of the voltage, that the matrix of the picture elements may have an abitrary m×n picture elements in place of the 2×2 arrangement of the embodiments, and that the kind of semiconductor may be changed from silicon of the embodiments to another one with similar functions and effects.

What is claimed is:

1. A solid state imaging device comprising:
   a plurality of photoelectric conversion elements disposed at a surface of a semiconductor substrate of a first conductivity type in a matrix configuration, for storing signal charges corresponding to incident light;
   first signal lines for transferring said signal charges on said photoelectric conversion elements aligned in a predetermined direction line, along said predetermined direction;
   first switch means for transferring said signal charges stored in said photoelectric conversion elements to said first signal line, the first switch means having at least one MOS type transistor formed substantially in a transmission path of said incident light to an associated photoelectric conversion element;
   a second signal line for transmitting said signal charges from said first signal lines to an output terminal;
   second switch means for transferring said signal charges on said first signal lines to said second signal line; and
   scan means for scanning said first and second switch means in a predetermined order.

2. A solid state imaging device comprising:
   a plurality of photoelectric conversion elements disposed at a surface of a semiconductor substrate of a first conductivity type in a matrix configuration, for storing signal charges corresponding to incident lights;
   first signal lines for transferring said signal charges on said photoelectric conversion elements in a predetermined direction line, along the predetermined direction;
   first switch means for transferring said signal charges stored in said photoelectric conversion elements to said first signal lines, the first switch means having a first MOS type transistor having a first electrode formed of part of said photoelectric conversion element, a second MOS type transistor having a first electrode connected to the second electrode of said first MOS type transistor and a second electrode connected to said first signal line, said first MOS type transistor being formed on a surface of said semiconductor substrate, said second MOS type transistor formed on an insulation film on said semiconductor substrate in a transmission path of said incident light to an associated photoelectric conversion element;
   a second signal line for transferring said signal charges from said first signal lines to an output terminal;
   second switch means for transferring said signal charges on said first signal lines to said second signal line; and
   scan means for scanning said first and second switch means in a predetermined order.

3. A solid-state imaging device according to claim 2, wherein:
   said photoelectric conversion element having a pn junction formed of said semiconductor substrate and a first impurity doped region of a second conductivity type, which is opposite to said first conductivity type, formed in the substrate;
   said first MOS type transistor having a first electrode formed of said first impurity doped region, a second electrode formed of a second impurity doped region of the second conductivity type formed in said substrate and a gate electrode formed on said substrate through an insulation film; and said second MOS type transistor is formed of a first and a second electrode formed of a third and a fourth impurity doped region of the second conductivity type formed in a semiconductor film of the first conductivity type which is formed on an insulation film on said semiconductor substrate, and a gate electrode formed on said semiconductor film through an insulation film.

4. A solid-state imaging device, comprising:

a plurality of photoelectric conversion elements disposed at a surface of a semiconductor substrate of a first conductivity type in a matrix configuration, for storing signal charges corresponding to incident lights;

first signal lines for transferring amplifying signals caused by said signal charges on said photoelectric conversion elements in a predetermined direction line, along the predetermined direction;

first switch means for transferring amplifying signals caused by said signal charges stored in said photoelectric conversion elements to said first signal lines, the first switch means including amplifier means for converting said signal charge stored in said photoelectric conversion element into an electric current or voltage, amplifying the electric current or voltage and outputting the amplified current or voltage to said first signal line;

selection switch means for selecting a predetermined one among said plurality of photoelectric conversion elements, and supplying the charge on a selected photoelectric conversion element to an input part of said amplifier means; and reset means for resetting the charge on the input part of said amplifier means, said selection switch means being formed on a surface of said semiconductor substrate;

said amplifier means and said reset means being formed on an insulation film on said semiconductor substrate in a transmission path of said incident light to said predetermined photoelectric conversion element;

a second signal line for transferring said signal charges from said first signal lines to an output terminal;

second switch means for transferring said signal charges on said first signal lines to said second signal line; and scan means for scanning said first and second switch means in a predetermined order.

5. A solid-state imaging device according to claim 4, wherein:

said photoelectric conversion element has a pn junction formed of said semiconductor substrate and a first impurity doped region of a second conductivity type, which is opposite to said first conductivity type, formed in the substrate;

said selection switch means includes a first MOS type transistor having a first electrode formed of said first impurity doped region, a second electrode formed of a second impurity doped region of the second conductivity type formed in said substrate and a gate electrode formed on said substrate through an insulation film;

said reset means includes a second MOS type transistor having a first and a second electrode formed of a third and a fourth impurity doped region of the second conductivity type formed in a first semiconductor film of the first conductivity type which is formed on said semiconductor substrate through an insulation film, and a gate electrode formed on said first semiconductor film through an insulation film, said third impurity region and said second impurity region being mutually connected; and said amplifier means includes a third MOS transistor having a gate electrode formed of part of said third impurity doped region and a first and a second electrode formed of a fifth and a sixth impurity region formed in a second semiconductor film formed on said first semiconductor film through an insulation film on said semiconductor substrate.

6. A solid-state imaging device according to claim 4, wherein:

said photoelectric conversion element having a pn junction formed of said semiconductor substrate and a first impurity doped region of a second conductivity type, which is opposite to said first conductivity type, formed in the substrate;

said selection switch means includes a first MOS type transistor having a first electrode formed of said first impurity doped region, a second electrode formed of a third impurity doped region of the second conductivity type formed in a second impurity doped region of the first conductivity type formed in said first impurity doped region, and a gate electrode formed on said semiconductor substrate through an insulation film;

said reset means includes a second MOS type transistor having a first electrode formed of said third impurity doped region, a second electrode formed of a fourth impurity doped region of the second conductivity type formed in said second impurity doped region, and a gate electrode formed on said semiconductor substrate through an insulation film; and said amplifier means includes a third MOS type transistor having a first and a second electrode formed of a fifth and a sixth impurity doped region of the second conductivity type formed in said second impurity doped region, and a gate electrode formed on said semiconductor substrate through an insulation film, with said gate electrode being connected to said third impurity doped region.

7. A solid-state imaging device comprising:

a plurality of photoelectric conversion elements disposed at a surface of a semiconductor substrate in a matrix configuration, for storing signal charges corresponding to incident lights;

first signal lines for transferring said signal charges on said photoelectric conversion elements in a predetermined direction line, along the predetermined direction;

a plurality of first switch means for transferring said signal charges stored in said photoelectric conversion elements to said first signal lines, each first switch means including a MOS type transistor having a first electrode formed of part of an associated photoelectric conversion element, the MOS type transistor being formed substantially in a transmission path of said incident light to said photoelectric conversion element;

a second signal line for transferring said signal charges from said first signal lines to an output terminal;

second switch means for transferring said signal charges on said first signal lines to said second signal line; and scan means for scanning said first and second switch means in a predetermined order.

8. A solid-state imaging device according to claim 7, in which:

said photoelectric conversion element has a pn junction formed of said semiconductor substrate and a first impurity doped region of a second conductivity type formed in the substrate; and said MOS type transistor has a first electrode formed of said first impurity doped region, a second electrode formed of a third impurity doped region of the second conductivity type formed in a second impurity doped region of the first conductivity type formed in said first impurity doped region, and a gate electrode formed on said semiconductor substrate through an insulation film.

9. A solid-state imaging device comprising:

a semiconductor substrate;

a plurality of photoelectric conversion elements formed at a surface region of the semiconductor substrate and disposed in a two-dimensional pattern, for storing signal charges corresponding to light information; and means for reading said signal charges stored in said photoelectric conversion elements, provided separately of said photoelectric conversion elements and having at least one element formed substantially in a transmission path of said incident light with respect to each of said photoelectric conversion elements in said semiconductor substrate.

10. A solid-state imaging device according to claim 9, further comprising a semiconductor region formed above said semiconductor substrate with an interposition of an insulating material, wherein said at least one element is formed in said semiconductor region.

11. A solid-state imaging device according to claim 9, wherein said reading means has another at least one element formed in an impurity doped region formed in said semiconductor substrate, the impurity doped region constituting part of said photoelectric conversion element.

12. A solid-state imaging device according to claim 10, wherein at least part of said semiconductor region has a thickness of not more than 1000 Å along the direction of light injection.

13. A solid-state imaging device according to claim 10, wherein said reading means includes an active element and a switch element corresponding to each of said photoelectric conversion elements, the switch element is formed in said semiconductor substrate adjacent to the associated photoelectric conversion element, and said active element is formed in said semiconductor region.

* * * * *